United States Patent
Furuya et al.

(10) Patent No.: US 8,875,085 B2
(45) Date of Patent: Oct. 28, 2014

(54) WIRING INSPECTION APPARATUS AND WIRING INSPECTION METHOD

(71) Applicant: Fujitsu Limited, Kawasaki (JP)

(72) Inventors: Akiko Furuya, Yokohama (JP); Nobuaki Kawasoe, Yokohama (JP); Koji Migita, Kawasaki (JP); Masato Oota, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/132,542

(22) Filed: Dec. 18, 2013

(65) Prior Publication Data

US 2014/0289689 A1 Sep. 25, 2014

(30) Foreign Application Priority Data

Mar. 25, 2013 (JP) .................................. 2013-063089

(51) Int. Cl.
  *G06F 17/50* (2006.01)
(52) U.S. Cl.
  CPC .................................. *G06F 17/5077* (2013.01)
  USPC .......................................... 716/136; 716/111
(58) Field of Classification Search
  None
  See application file for complete search history.

(56) References Cited

FOREIGN PATENT DOCUMENTS

| | | |
|---|---|---|
| JP | 62-139342 | 6/1987 |
| JP | 02-045957 | 2/1990 |
| JP | 02-060148 | 2/1990 |
| JP | 04-85959 | 3/1992 |
| JP | 04-142096 | 5/1992 |
| JP | 05-29460 | 2/1993 |
| JP | 2001-142930 | 5/2001 |
| JP | 2005-228124 | 8/2005 |

*Primary Examiner* — Leigh Garbowski
(74) *Attorney, Agent, or Firm* — Fujitsu Patent Center

(57) ABSTRACT

A wiring inspection apparatus includes a first calculating unit, a second calculating unit, and an output unit. The first calculating unit calculates the number of components arranged along two sides, one of which extends in a first direction and the other one of which extends in a second direction, of a minimum rectangle including a transmission component and a reception component. The second calculating unit calculates the number of the components arranged along the two sides at a predetermined arrangement density of relay components. When the number of the relay components is greater than the number of the components calculated by the second calculating unit, the output unit outputs information indicating the presence of a wiring extending in a direction opposite to a direction from the transmission component to the reception component among wirings connecting the transmission component, the reception component, and the relay components.

4 Claims, 8 Drawing Sheets

WIRING INSPECTION APPARATUS AND WIRING INSPECTION METHOD

CROSS-REFERENCE TO RELATED APPLICATION(S)

This application is based upon and claims the benefit of priority of the prior Japanese Patent Application No. 2013-063089, filed on Mar. 25, 2013, the entire contents of which are incorporated herein by reference.

FIELD

The embodiments discussed herein are directed to a wiring inspection apparatus and a wiring inspection method.

BACKGROUND

There is a technology for designing circuits by using an electronic design automation (EDA) tool, such as a computer aided design (CAD) tool. For example, the EDA tool enables automatic wiring between two cells (for example, a latch, a flip-flop, and the like) that are designated to be connected. In recent years, in the physical design of a circuit, the number of cases is increasing, in which a timing problem occurs due to the presence of a bypass wiring extending in a direction opposite to a direction of approach from a cell that transmits a signal to a cell that receives the signal among wirings from the cell that transmits the signal to the cell that receives the signal. The reason why the number of the cases with the timing problem is increasing is that, in recent years, the operating frequencies of circuits have increased and the density of the circuits has increased due to the miniaturization of technologies.

In a circuit with the timing problem, operation is sometimes not performed normally. Therefore, conventionally, a wiring inspection method has been proposed to inspect whether there is a bypass wiring, in order to detect a circuit that does not operate normally. As an example of the wiring inspection method, there is a method in which a human visually inspects a circuit after wiring. As another example of the wiring inspection method, there is a method in which a computer inspects whether there is a bypass wiring based on a wiring pattern of a circuit after wiring. As for an example of the conventional techniques, see Japanese Laid-open Patent Publication No. 10-74842 and Japanese Laid-open Patent Publication No. 05-29460, for example.

However, in the wiring inspection method as described above, in some cases, inspection is sometimes not performed in a simple and easy manner. For example, in the method in which a human visually inspects a circuit after wiring, it takes a long time for a human to inspect more than thousands of wirings. Therefore, in the method in which a human visually inspects a circuit after wiring, it is difficult to perform the inspection in a simple and easy manner. Furthermore, in the method in which a computer inspects whether there is a bypass wiring based on a wiring pattern of a circuit after wiring, the same problem occurs. Specifically, in the method in which a computer inspects whether there is a bypass wiring, a wiring pattern is analyzed based on data indicating the wiring pattern, and whether there is a bypass wiring is inspected based on the analyzed wiring pattern. Therefore, it takes a long time to analyze the wiring pattern and inspect whether there is a bypass wiring based on the analyzed wiring pattern. Consequently, even in the method in which the computer inspects whether there is a bypass wiring based on a wiring pattern of a circuit after wiring, it is difficult to perform the inspection in a simple and easy manner.

SUMMARY

According to an aspect of an embodiment, a wiring inspection apparatus includes a first calculating unit, a second calculating unit, and an output unit. The first calculating unit calculates a number of components each having a predetermined size, when the components are arranged along two sides, one of which extends in a first direction and the other one of which extends in a second direction crossing the first direction, of a minimum rectangle including a reception component and a transmission component that transmits a signal to the reception component via a plurality of relay components. The second calculating unit calculates a number of the components when the components are arranged along the two sides at a predetermined arrangement density of the relay components, based on the number of the components calculated by the first calculating unit and based on the predetermined arrangement density. The output unit outputs information indicating presence of a wiring extending in a direction opposite to a direction from the transmission component to the reception component among wirings connecting the transmission component, the reception component, and the relay components, when a number of the relay components is greater than the number of the components calculated by the second calculating unit.

According to another aspect of an embodiment, a wiring inspection apparatus includes a first calculating unit, a second calculating unit, and an output unit. The first calculating unit calculates a total area of components each having a predetermined size, when the components are arranged along two sides, one of which extends in a first direction and the other one of which extends in a second direction crossing the first direction, of a minimum rectangle including a reception component and a transmission component that transmits a signal to the reception component via a plurality of relay components. The second calculating unit calculates a total area of the components when the components are arranged along the two sides at a predetermined arrangement density of the relay components, based on the total area of the components calculated by the first calculating unit and based on the predetermined arrangement density. The output unit outputs information indicating presence of a wiring extending in a direction opposite to a direction from the transmission component to the reception component among wirings connecting the transmission component, the reception component, and the relay components, when a total area of the relay components is greater than the total area of the components calculated by the second calculating unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present invention is not limited to the embodiments below.

[a] First Embodiment

Figure 1:
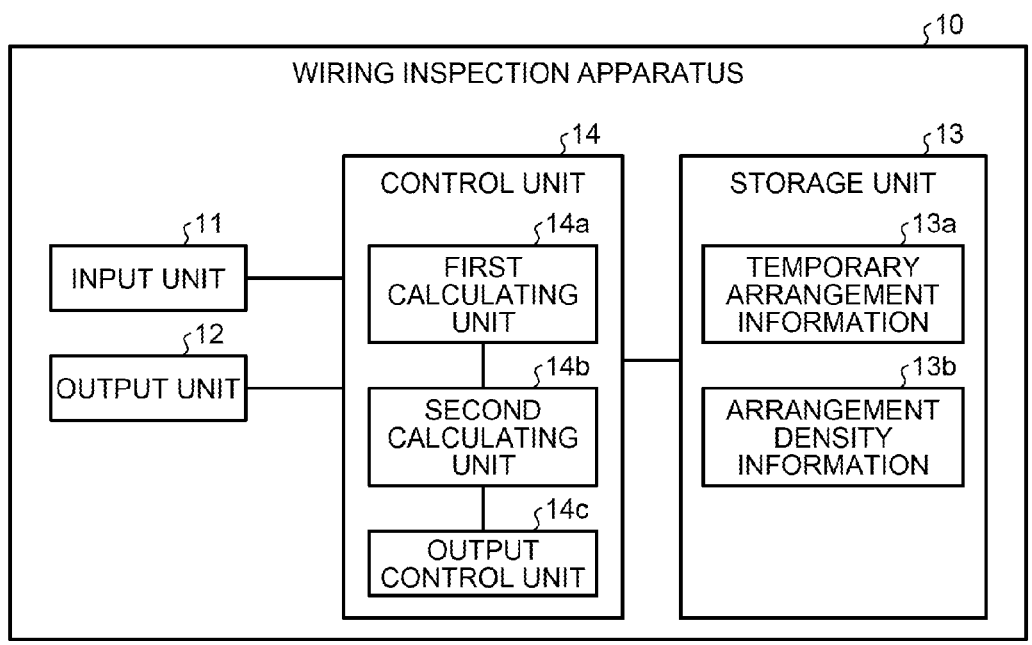
FIG. 1 is a diagram illustrating an example of a functional configuration of a wiring inspection apparatus according to a first embodiment.

A wiring inspection apparatus according to a first embodiment will be explained. FIG. 1 is a diagram illustrating an example of a functional configuration of the wiring inspection apparatus according to the first embodiment.

Functional Configuration of the Wiring Inspection Apparatus

As illustrated in FIG. 1, a wiring inspection apparatus 10 includes an input unit 11, an output unit 12, a storage unit 13, and a control unit 14.

The input unit 11 inputs various types of information to the control unit 14. For example, the input unit 11 receives an instruction to perform a wiring inspection process (to be described later) from a user, and inputs the received instruction to the control unit 14. An example of a timing at which the user inputs the instruction to perform the wiring inspection process to the control unit 14 via the input unit 11 will be explained below. Examples of the timing include a timing at which a cell is temporarily arranged, a timing at which a clock tree is generated, and a timing at which temporary wiring is performed, in a physical design flow (to be described later). Namely, in the physical design, the wiring inspection apparatus 10 according to the first embodiment can perform the wiring inspection process before performing detailed wiring. The reason why the wiring inspection process can be performed before the detailed wiring is that, as will be described later, the wiring inspection apparatus 10 can inspect whether there is a bypass wiring based on the positional relationship of cells and the number of the cells, without using wiring pattern data indicating a wiring pattern. As an example of a device serving as the input unit 11, a device, such as a mouse or a keyboard, that receives user operation may be employed.

The output unit 12 outputs various types of information. For example, the output unit 12 displays a message indicating the presence of a bypass wiring under the control of an output control unit 14c (to be described later). Examples of the message include a message of "There is a bypass wiring. A wiring (XXX) is the bypass wiring". Meanwhile, "XXX" is an identifier for identifying a wiring, and may be, for example, a wiring name or a position coordinate. Furthermore, the output unit 12 displays a message indicating the absence of a bypass wiring under the control of the output control unit 14c (to be described later). Examples of the message include a message of "There is no bypass wiring". As an example of a device serving as the output unit 12, a liquid crystal display may be employed.

The storage unit 13 stores therein various types of information. For example, the storage unit 13 stores therein temporary arrangement information 13a and arrangement density information 13b.

The temporary arrangement information 13a contains arrangement information on each of cells in the physical design area when temporary arrangement is performed in a physical design.

The arrangement density information 13b contains a cell arrangement density D [%] that is contained in constraint conditions when initial setting is performed in the physical design. Meanwhile, the cell arrangement density D is, for example, the upper limit of a cell arrangement density.

The storage unit 13 is a storage device such as a semiconductor memory device including a flash memory, or a storage device such as a hard disk or an optical disk. The storage unit 13 is not limited to the storage device as described above, and may be a random access memory (RAM) or a read only memory (ROM).

The control unit 14 includes an internal memory for storing programs that defines flows of various processes or for storing control data, and performs the various processes with the programs and data. As illustrated in FIG. 1, the control unit 14 includes a first calculating unit 14a, a second calculating unit 14b, and an output control unit 14c.

The first calculating unit 14a calculates the number of minimum cells when the minimum cells are arranged along two sides, one of which extends in the X-axis direction and the other one of which extends in the Y-axis direction, of a minimum rectangle including a cell of a transmitting-side flip-flop (FF) and a cell of a receiving-side flip-flop. Meanwhile, the minimum cell indicates, for example, a cell with a predetermined minimum size. Furthermore, the transmitting-side flip-flop indicates, for example, a flip-flop serving as a starting point for transmitting a signal. Moreover, the receiving-side flip-flop indicates, for example, a flip-flop serving as an end point for receiving the signal. In the explanation below, a cell of the transmitting-side flip-flop may be referred to as "a transmitting-side FF" and a cell of the receiving-side flip-flop may be referred to as "a receiving-side FF". Furthermore, the X-axis and the Y-axis intersect with each other.

An example of the first calculating unit 14a will be explained below. For example, when an instruction to perform a wiring inspection process (to be described later) is input to the control unit 14 via the input unit 11, the first calculating unit 14a performs processes as described below. Specifically, the first calculating unit 14a acquires the temporary arrangement information 13a stored in the storage unit 13. Subsequently, the first calculating unit 14a specifies arrangement information that is contained in the temporary arrangement information 13a and that is about a transmitting-side FF temporarily arranged in the physical design area. Furthermore, the first calculating unit 14a specifies arrangement information that is contained in the temporary arrangement information 13a and that is about a receiving-side FF temporarily arranged in the physical design area. Then, the first calculating unit 14a performs processes as described below, based on the arrangement information on the transmitting-side FF in the physical design area and the arrangement information on the receiving-side FF in the physical design area. Specifically, the first calculating unit 14a arranges the transmitting-side FF and the receiving-side FF in a predetermined area so as to correspond to the positional relationship of the transmitting-side FF and the receiving-side FF arranged in the physical design area. Then, the first calculating unit 14a calculates the number m of minimum cells when the minimum cells are arranged without space along the two sides, one of which extends in the X-axis direction and the other one of which extends in the Y-axis direction, of the minimum rectangle including the transmitting-side FF and the receiving-side FF. The value of the number m of the minimum cells corresponds to a Manhattan distance from the cell of the transmitting-side FF to the cell of the receiving-side FF on the assumption that the minimum cell is represented by a square with side length of "1".

Figure 2:
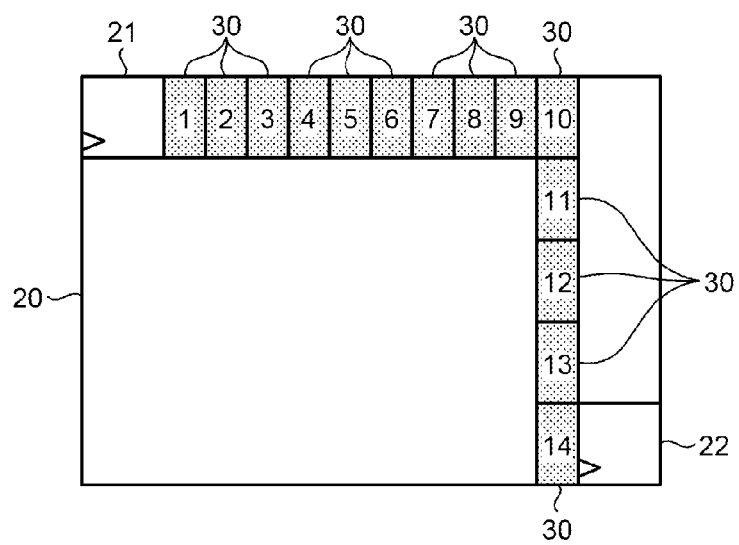
FIG. 2 is a diagram for explaining an example of a process performed by the wiring inspection apparatus according to the first embodiment.

FIG. 2 is a diagram for explaining an example of a process performed by the wiring inspection apparatus according to the first embodiment. Specifically, FIG. 2 is a diagram for explaining an example of a process performed by the first calculating unit 14a when, for example, the arrangement information on the transmitting-side FF in the physical design area and the arrangement information on the receiving-side FF in the physical design area are specified. In this case, for example, the first calculating unit 14a performs processes as described below so as to correspond to the positional relationship of the transmitting-side FF and the receiving-side FF arranged in the physical design area. Specifically, as illustrated in FIG. 2, the first calculating unit 14a arranges a transmitting-side FF 21 and a receiving-side FF 22 in a predetermined area. Then, as illustrated in FIG. 2, the first calculating unit 14a calculates the number m of minimum cells 30 when the minimum cells are arranged without space along two sides, one of which extends in the X-axis direction and the other one of which extends in the Y-axis direction, of a minimum rectangle 20 including the transmitting-side FF 21 and the receiving-side FF 22. Meanwhile, in the example in FIG. 2, the number m of the minimum cells 30 is "14".

Referring back to FIG. 1, the second calculating unit 14b performs processes as described below, based on the calculated number m of the minimum cells and the cell arrangement density D in the physical design area. Specifically, the second calculating unit 14b calculates the number M of the minimum cells when the minimum cells are arranged along the two sides, one of which extends in the X-axis direction and the other one of which extends in the Y-axis direction, of the minimum rectangle at the arrangement density D.

An example of the second calculating unit 14b will be explained below. For example, when the first calculating unit 14a calculates the number m of the minimum cells, the second calculating unit 14b acquires the arrangement density information 13b from the storage unit 13. Subsequently, the second calculating unit 14b specifies the arrangement density D contained in the arrangement density information 13b and performs processes as described below. Specifically, the second calculating unit 14b calculates, by Equation (1) below, the number M of the minimum cells when the minimum cells are arranged along the two sides, one of which extends in the X-axis direction and the other one of which extends in the Y-axis direction, of the minimum rectangle at the arrangement density D.

$$M = m \times (D/100) \quad (1)$$

Here, "x" is a sign indicating multiplication and "/" is a sign indicating division. Furthermore, in Equation (1), the number M of the minimum cells indicates a natural number obtained by rounding a value of "m×(D/100)" up to an integer.

Figure 3:
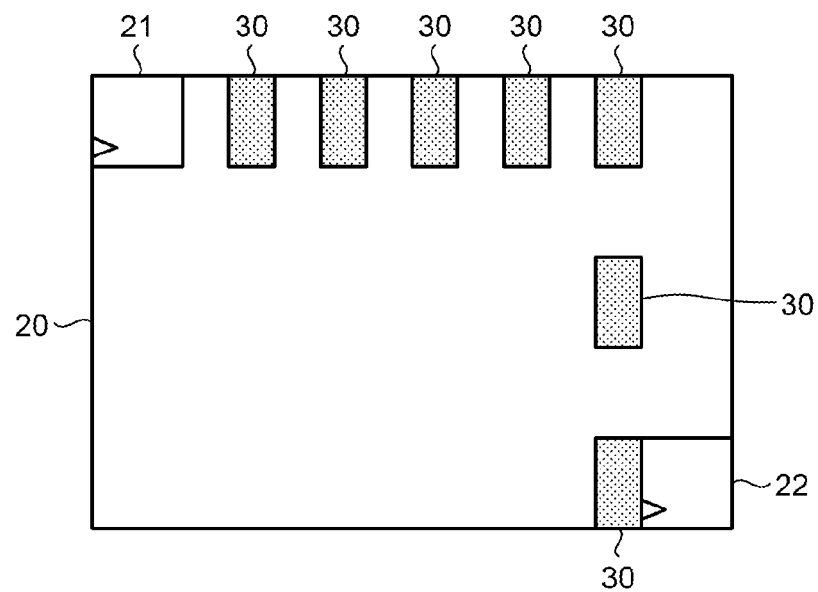
FIG. 3 is a diagram illustrating an example in which M minimum cells are virtually arranged.

FIG. 3 is a diagram illustrating an example in which the M minimum cells are virtually arranged. In the example in FIG. 3, when the number M of the minimum cells calculated by the second calculating unit 14b is "7", the "7" minimum cells 30 are arranged along the two sides, one of which extends in the X-axis direction and the other one of which extends in the Y-axis direction, of the minimum rectangle 20.

Figure 4:
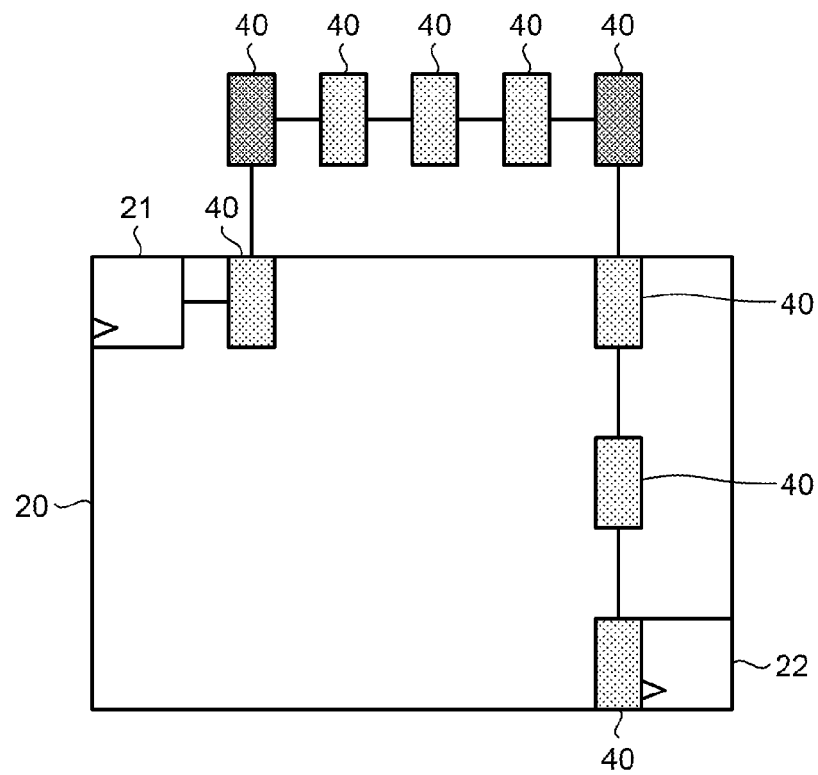
FIG. 4 is a diagram illustrating an example in which cells that are actually arranged between a transmitting-side FF and a receiving-side FF are arranged in a predetermined area.

The second calculating unit 14b specifies the number N of cells, such as buffers, that are actually arranged between the transmitting-side FF and the receiving-side FF, based on the temporary arrangement information 13a. FIG. 4 is a diagram illustrating an example in which the cells that are actually arranged between the transmitting-side FF and the receiving-side FF are arranged in a predetermined area. In the example in FIG. 4, nine cells 40 that are actually arranged between the transmitting-side FF 21 and the receiving-side FF 22 are arranged in a predetermined area. In the example in FIG. 4, the second calculating unit 14b specifies "9" as the number of the cells 40 that are actually arranged between the transmitting-side FF 21 and the receiving-side FF 22.

Referring back to FIG. 1, when the number N of the cells that are actually arranged between the transmitting-side FF and the receiving-side FF is greater than the number M of the minimum cells, the output control unit 14c performs a process as described below. Specifically, the output control unit 14c causes the output unit 12 to output a message indicating the presence of a bypass wiring among wirings connecting the cell of the transmitting-side FF, the cell of the receiving-side FF, and the cells actually arranged between the transmitting-side FF and the receiving-side FF.

An example of the output control unit 14c will be explained below. For example, when the second calculating unit 14b calculates the number M of the minimum cells and specifies the number N, the output control unit 14c compares the number N and the number M to determine whether the number N is greater than the number M. If the number N is greater than the number M, there is a bypass wiring among the wirings connecting the cells arranged between the transmitting-side FF and the receiving-side FF. In contrast, if the number N is equal to or smaller than the number M, there is no bypass wiring among the wirings connecting the cells arranged between the transmitting-side FF and the receiving-side FF. Therefore, if the number N is greater than the number M, the output control unit 14c determines that there is a bypass wiring and causes the output unit 12 to output a message indicating the presence of a bypass wiring among the wirings connecting the cells. For example, the output control unit 14c causes the output unit 12 to display a message of "There is a bypass wiring. A wiring (XXX) is the bypass wiring".

In contrast, if the number N is equal to or smaller than the number M, the output control unit 14c performs a process as described below. Specifically, the output control unit 14c determines that there is no bypass wiring and causes the output unit 12 to output a message indicating the absence of a bypass wiring among the wirings connecting the cells. For example, the output control unit 14c causes the output unit 12 to output a message of "There is no bypass wiring".

The control unit 14 is a circuit, such as an application specific integrated circuit (ASIC), a field programmable gate array (FPGA), a central processing unit (CPU), or a micro processing unit (MPU).

Flow of Process

Figure 5:
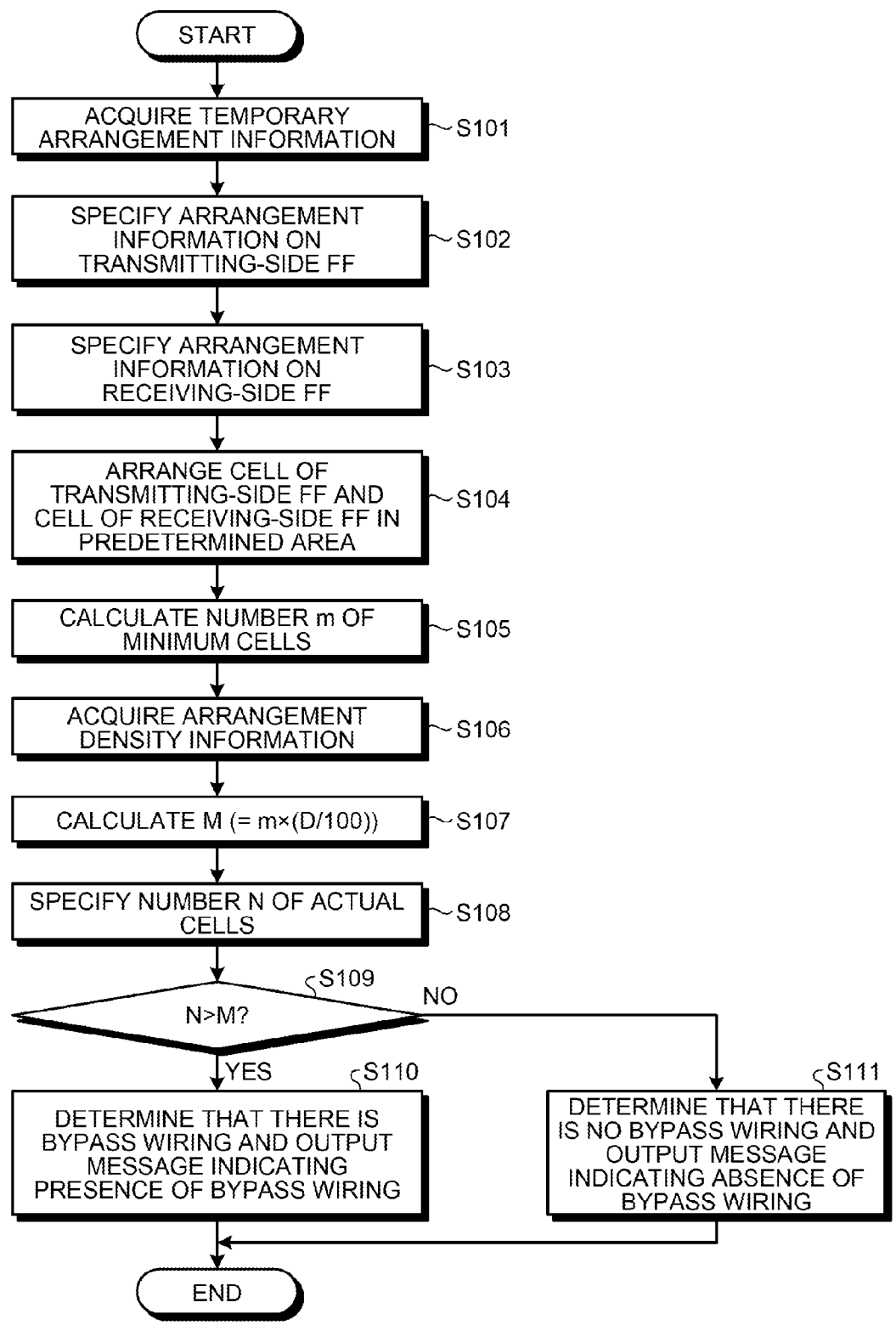
FIG. 5 is a flowchart illustrating a flow of a wiring inspection process according to the first embodiment.

The flow of a process performed by the wiring inspection apparatus 10 according to the first embodiment will be described below. FIG. 5 is a flowchart illustrating the flow of the wiring inspection process according to the first embodiment. The wiring inspection process according to the first embodiment is performed at a timing at which, for example, the control unit 14 receives an instruction to perform the wiring inspection process from the input unit 11. Furthermore, the wiring inspection process according to the first embodiment is performed for each net. Meanwhile, the "net" indicates connection between a cell serving as a starting point for outputting a signal and a cell serving as an end point for receiving the signal. Furthermore, examples of the timing to perform the wiring inspection process include a timing at which a cell is temporarily arranged, a timing at which a clock tree is generated, and a timing at which temporary wiring is performed, in the physical design flow (to be described later).

As illustrated in FIG. 5, the first calculating unit 14a acquires the temporary arrangement information 13a stored in the storage unit 13 (S101). Subsequently, the first calculating unit 14a specifies arrangement information that is contained in the temporary arrangement information 13a and that is about a transmitting-side FF temporarily arranged in the physical design area (S102). Then, the first calculating unit 14a specifies the arrangement information that is contained in the temporary arrangement information 13a and that is about a receiving-side FF temporarily arranged in the physical design area (S103).

Subsequently, the first calculating unit 14a performs processes as described below, based on the arrangement information on the transmitting-side FF in the physical design area and the arrangement information on the receiving-side FF in the physical design area. Specifically, the first calculating unit 14a arranges the transmitting-side FF and the receiving-side FF in a predetermined area so as to correspond to the positional relationship of the transmitting-side FF and the receiving-side FF arranged in the physical design area (S104). Then, the first calculating unit 14a calculates the number m of minimum cells when the minimum cells are arranged without space along two sides, one of which extends in the X-axis direction and the other one of which extends in the Y-axis direction, of a minimum rectangle including the transmitting-side FF and the receiving-side FF (S105).

Subsequently, the second calculating unit 14b acquires the arrangement density information 13b from the storage unit 13 (S106). Then, the second calculating unit 14b specifies the arrangement density D contained in the arrangement density information 13b and performs processes as described below. Specifically, the second calculating unit 14b calculates, by Equation (1) described above, the number M of the minimum cells when the minimum cells are arranged along the two sides, one of which extends in the X-axis direction and the other one of which extends in the Y-axis direction, of the minimum rectangle at the arrangement density D (S107).

Then, the second calculating unit 14b specifies the number N of cells that are actually arranged between the transmitting-side FF and the receiving-side FF, based on the temporary arrangement information 13a (S108).

Subsequently, the output control unit 14c compares the number N and the number M to determine whether the number N is greater than the number M (S109). If the number N is greater than the number M (Yes at S109), the output control unit 14c determines that there is a bypass wiring and causes the output unit 12 to output a message indicating the presence of a bypass wiring among the wirings connecting the cells (S110), and then the process is terminated.

In contrast, if the number N is equal to or smaller than the number M (NO at S109), the output control unit 14c determines that there is no bypass wiring and causes the output unit 12 to output a message indicating the absence of a bypass wiring among the wirings connecting the cells (S111), and then the process is terminated.

Figure 6:
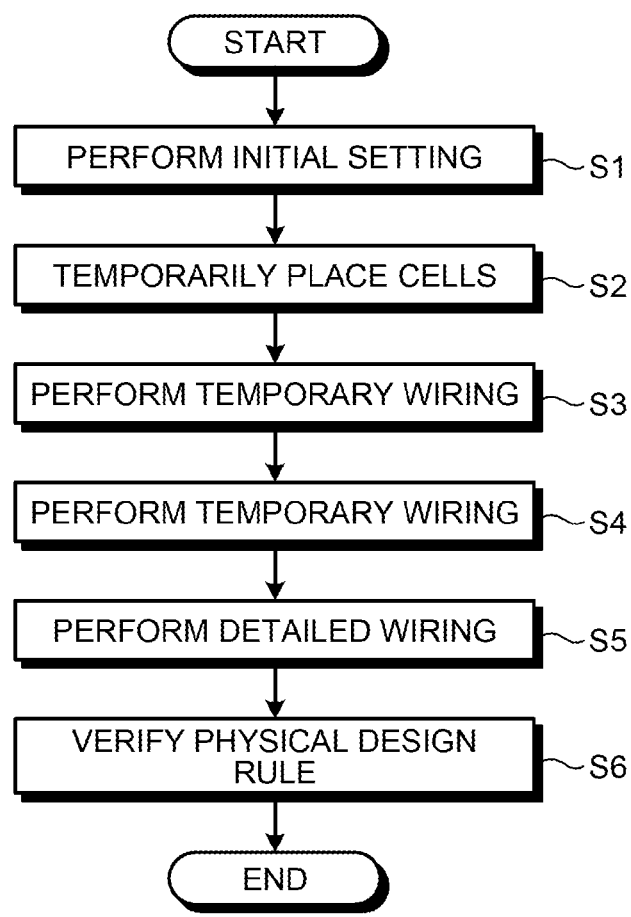
FIG. 6 is a flowchart illustrating a flow of a physical design of a circuit.

A timing to perform the wiring inspection process will be described below. FIG. 6 is a flowchart illustrating the flow of a physical design of a circuit. The physical design illustrated in the example in FIG. 6 is performed by executing a predetermined physical design tool by a computer after completion of a logical design of the circuit. As illustrated in the example in FIG. 6, in the physical design, initial setting is performed first (S1). For example, at S1, a computer receives the size of a physical design area, in which a design block is arranged for each chip of a large scale integration (LSI) designated by a user, a library, and netlist generated by logic synthesis. Furthermore, at S1, the computer sets a fan-out and a frequency. Subsequently, in the physical design, the computer temporarily arranges cells. Specifically, the computer roughly arranges cells (S2). At S2, the computer arranges cells contained in the netlist. Subsequently, in the physical design, the computer generates a clock tree (S3). Then, in the physical design, the computer performs temporary wiring from a clock route pin to a clock terminal of each clock load cell (S4). Subsequently, in the physical design, the computer performs timing analysis and performs detailed wiring based on a result of the timing analysis (S5). Then, in the physical design, the computer checks whether the arranged cells and wirings satisfy a predetermined physical design rule, and if the physical design rule is not satisfied, performs correction (S6).

In the conventional method in which a human visually inspects a circuit after wiring, the human inspects whether there is a bypass wiring by viewing an abnormal portion based on a result of the timing analysis performed at S5 in the physical design as described above. Therefore, in the physical design of the conventional technology, it is difficult to inspect whether there is a bypass wiring in an earlier stage than Step S6. In contrast, the wiring inspection apparatus 10 according to the first embodiment inspects whether there is a bypass wiring by using the arrangement information on the cells. Therefore, the wiring inspection apparatus 10 can perform the wiring inspection process as described above in a stage after Step S3 at which the cells are temporarily arranged. Specifically, the wiring inspection apparatus 10 can inspect whether there is a bypass wiring in an earlier stage than Step S6. Therefore, the wiring inspection apparatus 10 can inspect whether there is a bypass wiring in an earlier stage of the physical design. Consequently, because the wiring inspection apparatus 10 can inspect whether there is a bypass wiring in the initial stage of the physical design, it becomes possible to reduce a loss in the process. Furthermore, the wiring inspection apparatus 10 can reduce an influence on the physical design, and therefore can reduce a risk of redesign.

As described above, the wiring inspection apparatus 10 calculates the number m of the minimum cells 30 when the minimum cells 30 are arranged along the two sides, one of which extends in the X-axis direction and the other one of which extends in the Y-axis direction, of the minimum rectangle 20 including the transmitting-side FF 21 and the receiving-side FF 22. Subsequently, the wiring inspection apparatus 10 calculates the number M of the minimum cells 30 when the minimum cells 30 are arranged along the two sides, one of which extends in the X-axis direction and the other one of which extends in the Y-axis direction, of the minimum rectangle 20 at the arrangement density D, based on the number m of the minimum cells and the cell arrangement density D.

If the number N of the cells 40 that are actually arranged between the transmitting-side FF 21 and the receiving-side FF 22 is greater than the number M of the minimum cells 30, the wiring inspection apparatus 10 performs a process as described below. Specifically, the wiring inspection apparatus 10 causes the output unit 12 to output a message indicating the presence of a bypass wiring among the wirings connecting the cell of the transmitting-side FF 21, the cell of the receiving-side FF 22, and the cells 40. Therefore, the wiring inspection apparatus 10 can inspect whether there is a bypass wiring based on the arrangement information on each of the cells, without performing a time-consuming process, such as a process of analyzing a wiring pattern based on data of the wiring pattern and inspecting whether there is a bypass wiring based on the analyzed wiring pattern. Consequently, the wiring inspection apparatus 10 can inspect a bypass wiring in a simple and easy manner.

Moreover, the wiring inspection apparatus 10 can inspect whether there is a bypass wiring in an earlier stage than Step S6 in the physical design as described above. Therefore, the wiring inspection apparatus 10 can inspect whether there is a bypass wiring in an earlier stage of the physical design. Consequently, because the wiring inspection apparatus 10 can inspect whether there is a bypass wiring in the initial stage of the physical design, it becomes possible to reduce a loss in the process. Furthermore, the wiring inspection apparatus 10 can reduce an influence on the physical design, and therefore can reduce a risk of redesign.

[b] Second Embodiment

Figure 7:
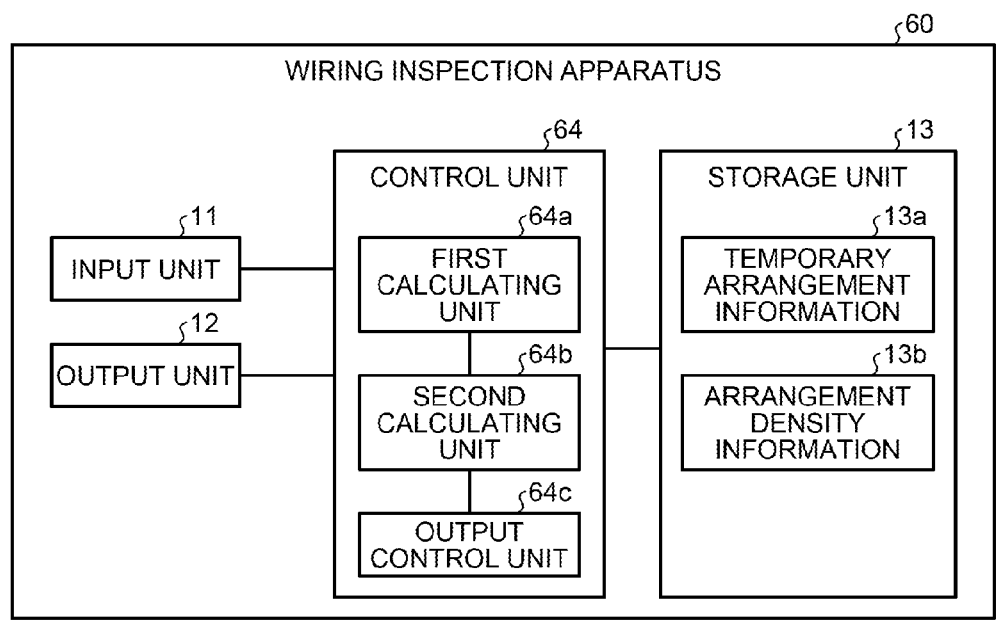
FIG. 7 is a diagram illustrating an example of a functional configuration of a wiring inspection apparatus according to a second embodiment.

A wiring inspection apparatus according to a second embodiment will be explained below. FIG. 7 is a diagram illustrating an example of a functional configuration of the wiring inspection apparatus according to the second embodiment. In the explanation below, the same functional components as those of the wiring inspection apparatus 10 of the first embodiment as illustrated in FIG. 1 are denoted by the same reference numerals and symbols, and the explanation thereof will be omitted.

Functional Configuration of the Wiring Inspection Apparatus

As illustrated in FIG. 7, a control unit 64 of a wiring inspection apparatus 60 includes a first calculating unit 64a, a second calculating unit 64b, and an output control unit 64c, instead of the first calculating unit 14a, the second calculating unit 14b, and the output control unit 14c of the control unit 14 of the first embodiment.

The first calculating unit 64a calculates a total area q [$\mu m^2$] of minimum cells when the minimum cells are arranged along two sides, one of which extends in the X-axis direction and the other one of which extends in the Y-axis direction, of a minimum rectangle including a transmitting-side FF and a receiving-side FF.

An example of the first calculating unit 64a will be explained below. For example, when an instruction to perform a wiring inspection process is input to the control unit 64 via the input unit 11, the first calculating unit 64a performs processes as described below. Specifically, the first calculating unit 64a acquires the temporary arrangement information 13a stored in the storage unit 13. Subsequently, the first calculating unit 64a specifies arrangement information that is contained in the temporary arrangement information 13a and that is about a transmitting-side FF temporarily arranged in the physical design area. Furthermore, the first calculating unit 64a specifies arrangement information that is contained in the temporary arrangement information 13a and that is about a receiving-side FF temporarily arranged in the physical design area. Then, the first calculating unit 64a performs processes as described below, based on the arrangement information on the transmitting-side FF in the physical design area and the arrangement information on the receiving-side FF in the physical design area. Specifically, the first calculating unit 64a arranges the transmitting-side FF and the receiving-side FF in a predetermined area so as to correspond to the positional relationship of the transmitting-side FF and the receiving-side FF arranged in the physical design area. Then, the first calculating unit 64a calculates the total area q of the minimum cells when the minimum cells are arranged without space along the two sides, one of which extends in the X-axis direction and the other one of which extends in the Y-axis direction, of the minimum rectangle including the transmitting-side FF and the receiving-side FF. For example, the first calculating unit 64a calculates the total area q of the minimum cells by using Equation (2) below.

$$q = s \times m \qquad (2)$$

Here, s is the area of a minimum cell. Furthermore, m is the number of the minimum cells when the minimum cells are arranged without space along the two sides, one of which extends in the X-axis direction and the other one of which extends in the Y-axis direction, of the minimum rectangle including the transmitting-side FF and the receiving-side FF as described above.

Figure 8:
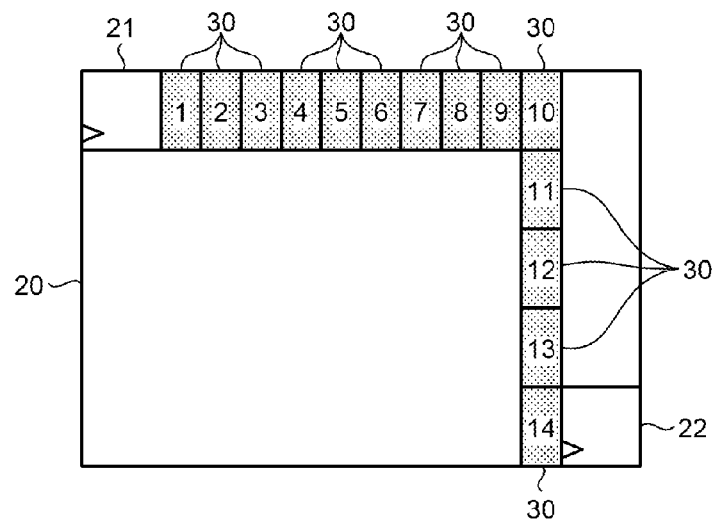
FIG. 8 is a diagram for explaining a process performed by the wiring inspection apparatus according to the second embodiment.

FIG. 8 is a diagram for explaining a process performed by the wiring inspection apparatus according to the second embodiment. Specifically, FIG. 8 is a diagram for explaining an example of a process performed by the first calculating unit 64a when, for example, the arrangement information on the transmitting-side FF in the physical design area and the arrangement information on the receiving-side FF in the physical design area are specified. In this case, as illustrated in FIG. 8 for example, the first calculating unit 64a performs processes as described below so as to correspond to the positional relationship of the transmitting-side FF and the receiving-side FF arranged in the physical design area. Specifically, the first calculating unit 64a arranges the transmitting-side FF 21 and the receiving-side FF 22 in a predetermined area. Then, as illustrated in FIG. 8, the first calculating unit 64a calculates the total area q of the minimum cells 30 when the minimum cells are arranged without space along the two sides, one of which extends in the X-axis direction and the other one of which extends in the Y-axis direction, of the minimum rectangle 20 including the transmitting-side FF 21 and the receiving-side FF 22.

Referring back to FIG. 7, the second calculating unit 64b performs processes as described below, based on the total area q of the minimum cells and the cell arrangement density D. Specifically, the second calculating unit 64b calculates a total area Q [$\mu m^2$] of the minimum cells when the minimum cells are arranged along the two sides, one of which extends in the X-axis direction and the other one of which extends in the Y-axis direction, of the minimum rectangle at the arrangement density D.

An example of the second calculating unit 64b will be explained below. For example, when the first calculating unit 64a calculates the total area q of the minimum cells, the second calculating unit 64b acquires the arrangement density information 13b from the storage unit 13. Subsequently, the second calculating unit 64b specifies the arrangement density D contained in the arrangement density information 13b and performs a process as described below. Specifically, the second calculating unit 64b calculates, by Equation (3) below, the total area Q of the minimum cells when the minimum cells are arranged along the two sides, one of which extends in the X-axis direction and the other one of which extends in the Y-axis direction, of the minimum rectangle at the arrangement density D.

$$Q = q \times (D/100) \quad (3)$$

Here, the total area Q of the minimum cells indicates a natural number obtained by rounding a value of "q×(D/100)" up to an integer.

Figure 9:
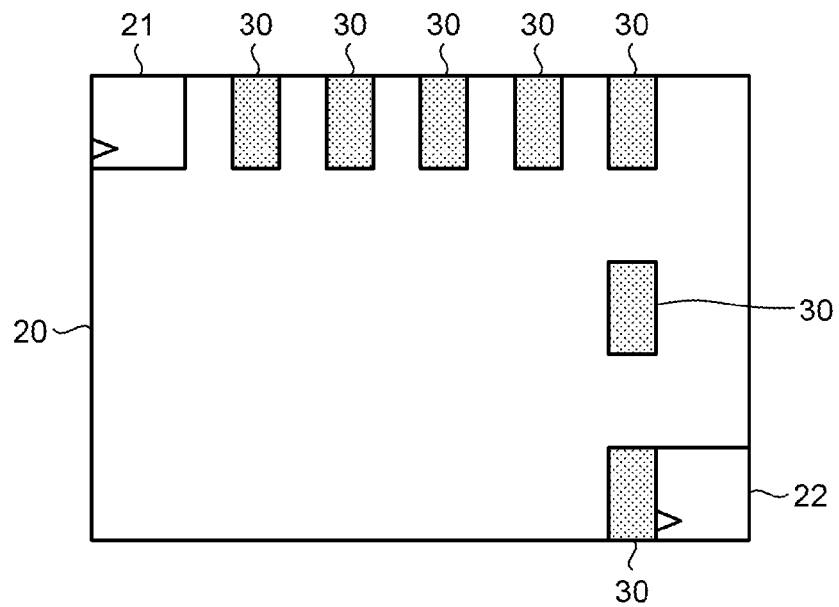
FIG. 9 is a diagram illustrating an example in which minimum cells, for which a total area Q is calculated by a second calculating unit of the second embodiment, are virtually arranged.

FIG. 9 is a diagram illustrating an example in which the minimum cells, for which the total area Q is calculated by the second calculating unit according to the second embodiment, are virtually arranged. In the example in FIG. 9, the seven minimum cells 30, for which the total area "s×7" is calculated by the second calculating unit 64b, are virtually arranged.

Figure 10:
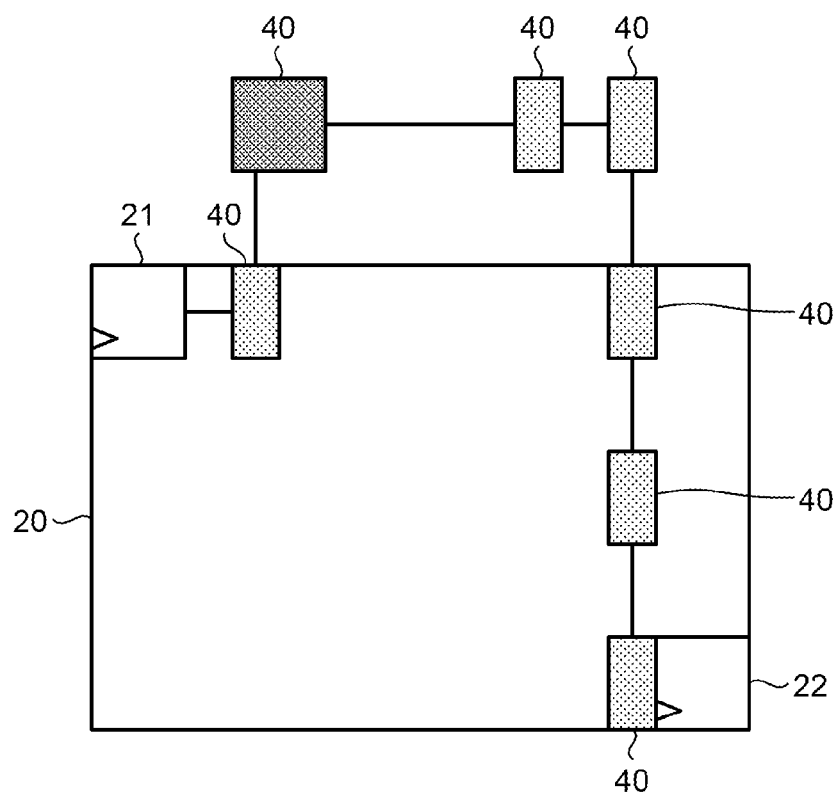
FIG. 10 is a diagram illustrating an example in which cells that are actually arranged between a transmitting-side FF and a receiving-side FF are arranged in a predetermined area.

Subsequently, the second calculating unit 64b specifies the area of each of cells, such as buffers, that are actually arranged between the transmitting-side FF and the receiving-side FF based on the temporary arrangement information 13a, and calculates a total area T [μm²] of the cells that are actually arranged between the transmitting-side FF and the receiving-side FF based on the specified area of each of the cells. FIG. 10 is a diagram illustrating an example in which the cells that are actually arranged between the transmitting-side FF and the receiving-side FF are arranged in a predetermined area. In the example in FIG. 10, the seven cells 40 that are actually arranged between the transmitting-side FF 21 and the receiving-side FF 22 are arranged in the predetermined area. In the example illustrated in FIG. 10, the second calculating unit 64b specifies the area of each of the seven cells 40 actually arranged between the transmitting-side FF 21 and the receiving-side FF 22, and calculates the total area T of the seven cells 40 based on the specified area of each of the seven cells 40.

Referring back to FIG. 7, when the total area T of the cells that are actually arranged between the transmitting-side FF and the receiving-side FF is greater than the total area Q of the minimum cells, the output control unit 64c performs a process as described below. Specifically, the output control unit 64c causes the output unit 12 to output a message indicating the presence of a bypass wiring among the wirings connecting the cell of the transmitting-side FF, the cell of the receiving-side FF, and the cells actually arranged between the transmitting-side FF and the receiving-side FF.

An example of the output control unit 64c will be explained below. For example, when the second calculating unit 64b calculates the total area Q of the minimum cells and the total area T of the cells, the output control unit 64c compares the total area Q and the total area T to determine whether the total area T is greater than the total area Q. If the total area T is greater than the total area Q, there is a bypass wiring among the wirings connecting the cells arranged between the transmitting-side FF and the receiving-side FF. In contrast, if the total area T is equal to or smaller than the total area Q, there is no bypass wiring among the wirings connecting the cells arranged between the transmitting-side FF and the receiving-side FF. Therefore, if the total area T is greater than the total area Q, the output control unit 64c determines that there is a bypass wiring and causes the output unit 12 to output a message indicating the presence of a bypass wiring among the wirings connecting the cells. For example, the output control unit 64c causes the output unit 12 to display a message of "There is a bypass wiring. A wiring (XXX) is the bypass wiring".

In contrast, if the total area T is equal to or smaller than the total area Q, the output control unit 64c performs a process as described below. Specifically, the output control unit 64c determines that there is no bypass wiring and causes the output unit 12 to output a message indicating the absence of a bypass wiring among the wirings connecting the cells. For example, the output control unit 64c causes the output unit 12 to display a message of "There is no bypass wiring".

The control unit 64 is a circuit, such as an ASIC, an FPGA, a CPU, or an MPU.

Flow of Process

Figure 11:
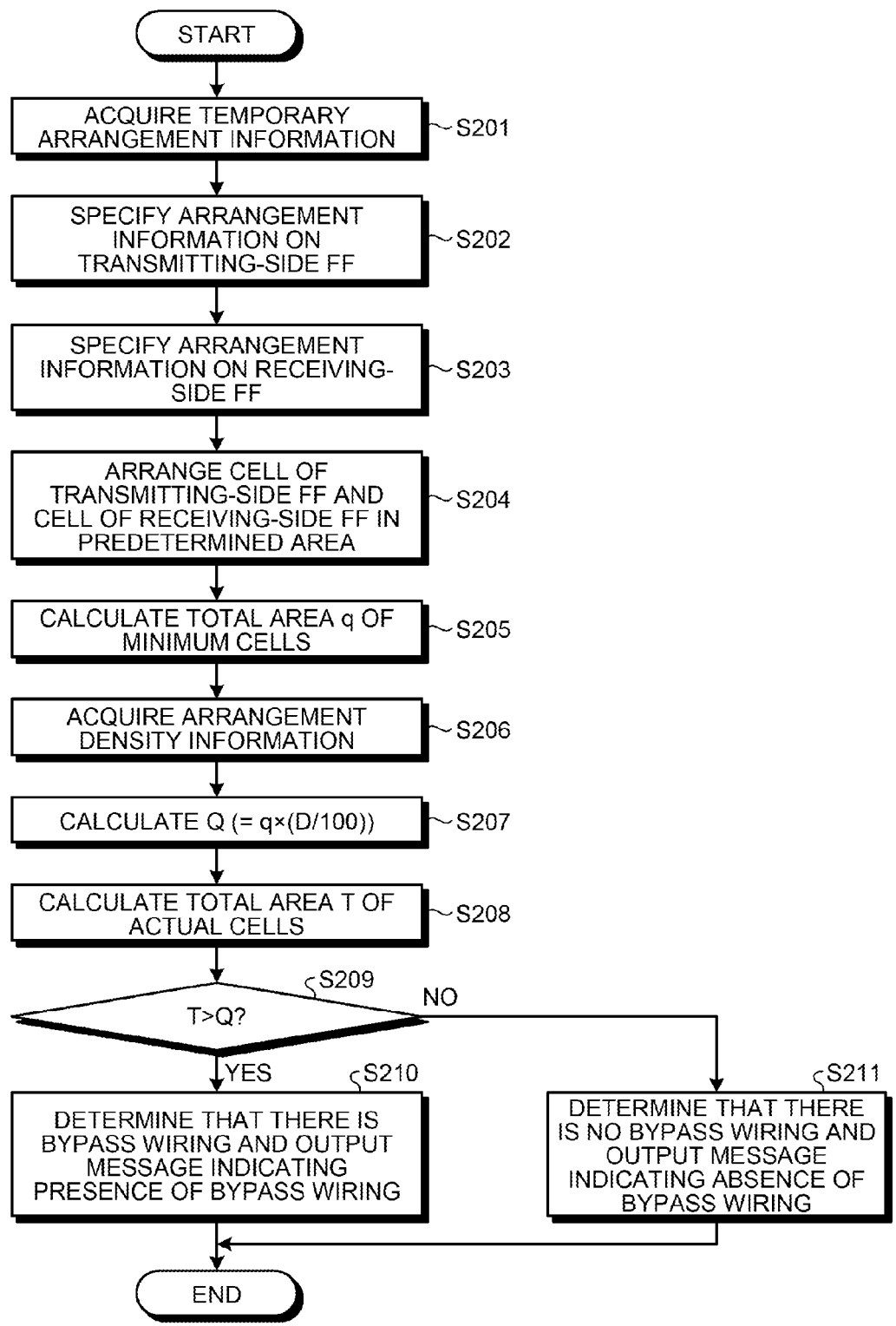
FIG. 11 is a flowchart illustrating a flow of a wiring inspection process according to the second embodiment.

The flow of a process performed by the wiring inspection apparatus 60 according to the second embodiment will be described below. FIG. 11 is a flowchart illustrating the flow of a wiring inspection process according to the second embodiment. The wiring inspection process according to the second embodiment is performed at the same timing as the wiring inspection process according to the first embodiment. Furthermore, the wiring inspection process according to the second embodiment is performed for each net, similarly to the wiring inspection process according to the first embodiment.

As illustrated in FIG. 11, the first calculating unit 64a acquires the temporary arrangement information 13a stored in the storage unit 13 (S201). Subsequently, the first calculating unit 64a specifies the arrangement information that is contained in the temporary arrangement information 13a and that is about the transmitting-side FF temporarily arranged in the physical design area (S202). Furthermore, the first calculating unit 64a specifies the arrangement information that is contained in the temporary arrangement information 13a and that is about the receiving-side FF temporarily arranged in the physical design area (S203).

Subsequently, the first calculating unit 64a performs processes as described below, based on the arrangement information on the transmitting-side FF in the physical design area and the arrangement information on the receiving-side FF in the physical design area. Specifically, the first calculating unit 64a arranges the transmitting-side FF and the receiving-side FF in a predetermined area so as to correspond to the positional relationship of the transmitting-side FF and the receiving-side FF arranged in the physical design area (S204). Then, the first calculating unit 64a calculates, by Equation (2) as described above, the total area q of the minimum cells when the minimum cells area arranged without space along two sides, one of which extends in the X-axis direction and the other one of which extends in the Y-axis direction, of a minimum rectangle including the transmitting-side FF and the receiving-side FF (S205).

Then, the second calculating unit 64b acquires the arrangement density information 13b from the storage unit 13 (S206). Subsequently, the second calculating unit 64b specifies the arrangement density D contained in the arrangement density information 13b and performs processes as described below. Specifically, the second calculating unit 64b calculates, by Equation (3) as described above, the total area Q of the minimum cells when the minimum cells are arranged along the two sides, one of which extends in the X-axis direction and the other one of which extends in the Y-axis direction, of the minimum rectangle at the arrangement density D (S207).

Then, the second calculating unit 64b calculates the total area T of cells that are actually arranged between the transmitting-side FF and the receiving-side FF, based on the temporary arrangement information 13a (S208).

Subsequently, the output control unit 64c compares the total area Q and the total area T to determine whether the total area T is greater than the total area Q (S209). If the total area T is greater than the total area Q (YES at S209), the output control unit 64c determines that there is a bypass wiring and causes the output unit 12 to output a message indicating the presence of a bypass wiring among the wirings connecting the cells (S210), and then the process is terminated.

In contrast, if the total area T is equal to or smaller than the total area Q (NO at S209), the output control unit 64c determines that there is no the bypass wiring and causes the output unit 12 to output a message indicating the absence of a bypass wiring among the wirings connecting the cells (S211), and then the process is terminated.

As described above, the wiring inspection apparatus 60 calculates the total area q of the minimum cells 30 when the minimum cells 30 are arrange along the two sides, one of which extends in the X-axis direction and the other one of which extends in the Y-axis direction, of the minimum rectangle 20 including the transmitting-side FF 21 and the receiving-side FF 22. Then, the wiring inspection apparatus 60 calculates the total area Q of the minimum cells 30 when the minimum cells 30 are arranged along the two sides, one of which extends in the X-axis direction and the other one of which extends in the Y-axis direction, of the minimum rectangle 20 at the arrangement density D, based on the total area q of the minimum cells and the cell arrangement density D. Subsequently, if the total area T of the cells 40 that are actually arranged between the transmitting-side FF 21 and the receiving-side FF 22 is greater than the total area Q of the minimum cells 30, the wiring inspection apparatus 60 performs a process as described below. Specifically, the wiring inspection apparatus 60 causes the output unit 12 to output a message indicating the presence of a bypass wiring among the wirings connecting the cell of the transmitting-side FF 21, the cell of the receiving-side FF 22, and the cells 40. Therefore, the wiring inspection apparatus 60 can inspect whether there is a bypass wiring based on the arrangement information on each of the cells and the number of the cells, without performing a time-consuming process, such as a process of analyzing a wiring pattern based on data of the wiring pattern and inspecting whether there is a bypass wiring based on the analyzed wiring pattern. Consequently, the wiring inspection apparatus 60 can inspect a bypass wiring in a simple and easy manner.

Moreover, the wiring inspection apparatus 60 can inspect whether there is a bypass wiring in an earlier stage than Step S6 in the physical design as described above. Therefore, the wiring inspection apparatus 60 can inspect whether there is a bypass wiring in an earlier stage of the physical design. Consequently, because the wiring inspection apparatus 60 can inspect whether there is a bypass wiring in the initial stage of the physical design, it becomes possible to reduce a loss in the process. The wiring inspection apparatus 60 can also reduce an influence on the physical design, and therefore can reduce a risk of redesign.

Furthermore, the wiring inspection apparatus 60 compares the total area Q of the minimum cells 30 and the total area T of the actually-arranged cells 40 to determine whether there is a bypass wiring. In this case, as illustrated in FIG. 10 for example, even when the number of the cells 40 is seven, if there is a cell 40 with a large area, the value of the total area T calculated by the wiring inspection apparatus 60 increases. Incidentally, the cell 40 with the large area is a cell that has high signal drive capability and is used for a long-distance wiring. Therefore, according to the wiring inspection apparatus 60, even if the number of the cells 40 that are actually arranged between the transmitting-side FF 21 and the receiving-side FF 22 is the same, the total area T increases as the area of each of the cells 40 increases. Therefore, if the cell 40 used for a long-distance wiring is actually arranged, the total area T increases and the wiring inspection apparatus 60 can easily determine a bypass wiring. Consequently, according to the wiring inspection apparatus 60, it is possible to accurately inspect a bypass wiring by taking the presence of a cell used for a long-distance wiring into account.

While the embodiments of the apparatus according to the present invention have been described above, the present invention may be embodied in various forms other than the above-described embodiments. For example, of the processes described in the embodiments, all or part of the processes described as being performed automatically may also be performed manually. Alternatively, all or part of the processes described as being performed manually may also be performed automatically by known methods.

Furthermore, the processes at Steps in any process described in the above embodiments may arbitrarily separated or integrated depending on various loads or use conditions. In some cases, Steps may be omitted.

Moreover, the order of the processes at Steps in any process described in the above embodiments may be changed depending on various loads or use conditions.

Furthermore, the components illustrated in the drawings are functionally conceptual and do not necessarily have to be physically configured in the manner illustrated in the drawings. Specifically, specific forms of distribution and integration of the apparatuses are not limited to those illustrated in the drawings, and all or part of the apparatuses can be functionally or physically distributed or integrated in arbitrary units depending on various loads or use conditions.

Wiring Inspection Program

Figure 12:
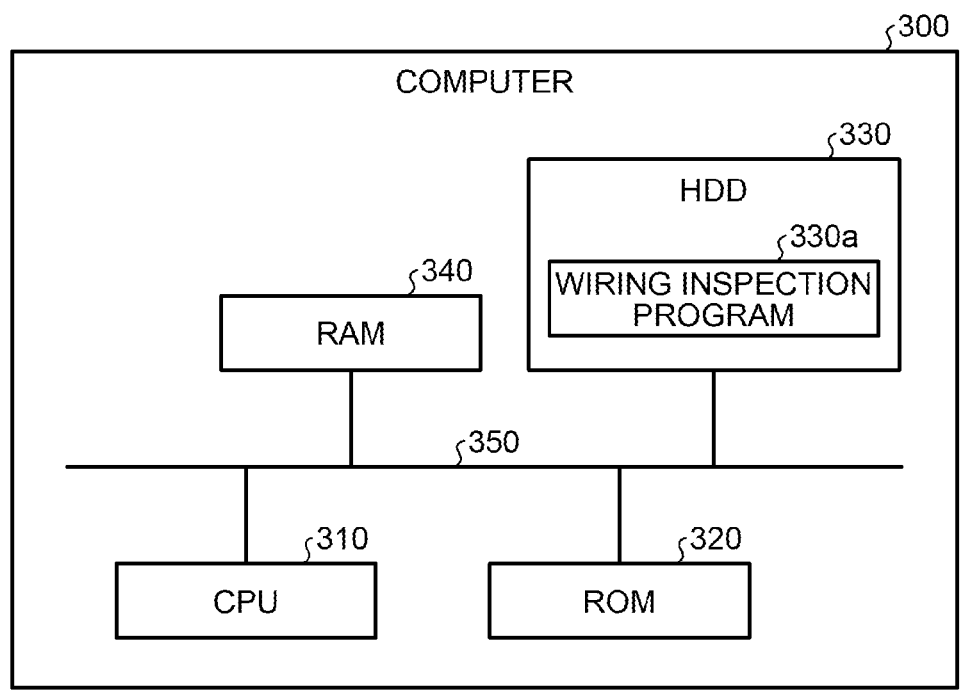
FIG. 12 is a diagram illustrating a computer that executes a wiring inspection program.

The various processes performed by the wiring inspection apparatus 10 or 60 described in the embodiments may be implemented by causing a computer system, such as a personal computer or a workstation, to execute a program provided in advance. Therefore, with reference to FIG. 12, an example of a computer will be explained below that executes a wiring inspection program having the same functions as those of the wiring inspection apparatus 10 or 60 described in the embodiments. FIG. 12 is a diagram illustrating the computer that executes the wiring inspection program.

As illustrated in FIG. 12, a computer 300 includes a CPU 310, a ROM 320, a hard disk drive (HDD) 330, and a RAM 340. The units 310 to 340 are connected to one another via a bus 350.

The ROM 320 stores therein a basic program, such as an operating system (OS). The HDD 330 stores therein, in advance, a wiring inspection program 330a that implements the same functions as those of the first calculating unit 14a, the second calculating unit 14b, and the output control unit 14c described in the embodiments. Alternatively, the HDD 330 stores therein, in advance, the wiring inspection program 330a that implements the same functions as those of the first calculating unit 64a, the second calculating unit 64b, and the output control unit 64c described in the embodiments. Incidentally, the wiring inspection program 330a may be separated appropriately. Moreover, the HDD 330 stores therein temporary arrangement information and arrangement density information. The temporary arrangement information corresponds to the temporary arrangement information 13a as described above, and the arrangement density information corresponds to the arrangement density information 13b as described above.

The CPU 310 reads the wiring inspection program 330a from the HDD 330 and executes the wiring inspection program 330a.

Furthermore, the CPU 310 reads the temporary arrangement information and the arrangement density information and stores them in the RAM 340. Moreover, the CPU 310 executes the wiring inspection program 330a by using the temporary arrangement information and the arrangement density information stored in the RAM 340. Incidentally, not all of the data stored in the RAM 340 need not always be stored in the RAM 340. It is sufficient to store, in the RAM 340, data to be used for a process.

Furthermore, the wiring inspection program 330a need not always be stored in the HDD 330 from the beginning.

For example, the wiring inspection program 330a may be stored in a "portable physical medium", such as a flexible disk (FD), a compact disk-ROM (CD-ROM), a digital versatile disk (DVD), a magnetooptical disk, or an integrated circuit (IC) card, that is insertable into the computer 300. Then, the computer 300 reads the wiring inspection program 330a from the medium and executes the wiring inspection program 330a.

Alternatively, the wiring inspection program 330a may be stored in "other computers (or servers)" connected to the computer 300 via a public line, the Internet, a local area network (LAN), or a wide area network (WAN). Then, the computer 300 reads the wiring inspection program 330a from the other computer or servers and executes the wiring inspection program 330a.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring inspection apparatus comprising:
    a first calculating unit that calculates a number of components each having a predetermined size, when the components are arranged along two sides, one of which extends in a first direction and the other one of which extends in a second direction crossing the first direction, of a minimum rectangle including a reception component and a transmission component that transmits a signal to the reception component via a plurality of relay components;
    a second calculating unit that calculates a number of the components when the components are arranged along the two sides at a predetermined arrangement density of the relay components, based on the number of the components calculated by the first calculating unit and based on the predetermined arrangement density; and
    an output unit that outputs information indicating presence of a wiring extending in a direction opposite to a direction from the transmission component to the reception component among wirings connecting the transmission component, the reception component, and the relay components, when a number of the relay components is greater than the number of the components calculated by the second calculating unit.

2. The wiring inspection apparatus according to claim 1, wherein when the number of the relay components is equal to or smaller than the number of the components calculated by the second calculating unit, the output unit outputs information indicating absence of the wiring extending in the direction opposite to the direction from the transmission component to the reception component among the wirings connecting the transmission component, the reception component, and the relay components.

3. A wiring inspection apparatus comprising:
    a first calculating unit that calculates a total area of components each having a predetermined size, when the components are arranged along two sides, one of which extends in a first direction and the other one of which extends in a second direction crossing the first direction, of a minimum rectangle including a reception component and a transmission component that transmits a signal to the reception component via a plurality of relay components;
    a second calculating unit that calculates a total area of the components when the components are arranged along the two sides at a predetermined arrangement density of the relay components, based on the total area of the components calculated by the first calculating unit and based on the predetermined arrangement density; and
    an output unit that outputs information indicating presence of a wiring extending in a direction opposite to a direction from the transmission component to the reception component among wirings connecting the transmission component, the reception component, and the relay components, when a total area of the relay components is greater than the total area of the components calculated by the second calculating unit.

4. The wiring inspection apparatus according to claim 3, wherein when the total area of the relay components is equal to or smaller than the total area of the components calculated by the second calculating unit, the output unit outputs information indicating absence of the wiring extending in the direction opposite to the direction from the transmission component to the reception component among the wirings connecting the transmission component, the reception component, and the relay components.

* * * * *